United States Patent
Hashimoto et al.

(10) Patent No.: US 8,409,772 B2
(45) Date of Patent: Apr. 2, 2013

(54) MASK BLANK AND METHOD OF MANUFACTURING A TRANSFER MASK

(75) Inventors: Masahiro Hashimoto, Tokyo (JP); Hiroyuki Iwashita, Tokyo (JP); Takahiro Hiromatsu, Tokyo (JP)

(73) Assignee: Hoya Corporation, Tokyo (JP)

( * ) Notice: Subject to any disclaimer, the term of this patent is extended or adjusted under 35 U.S.C. 154(b) by 170 days.

(21) Appl. No.: 13/008,356

(22) Filed: Jan. 18, 2011

(65) Prior Publication Data

US 2011/0177436 A1 Jul. 21, 2011

(30) Foreign Application Priority Data

Jan. 16, 2010 (JP) .................. 2010-007590

(51) Int. Cl.
*G03F 1/50* (2006.01)
(52) U.S. Cl. .................................................. 430/5
(58) Field of Classification Search ........... 430/5, 322, 430/323; 428/428, 430
See application file for complete search history.

(56) References Cited

U.S. PATENT DOCUMENTS

| | | | |
|---|---|---|---|
| 2006/0088774 A1 | 4/2006 | Yoshikawa et al. | |
| 2007/0212618 A1* | 9/2007 | Yoshikawa et al. | 430/5 |
| 2009/0117474 A1 | 5/2009 | Kominato et al. | |
| 2009/0253054 A1 | 10/2009 | Kominato et al. | |

FOREIGN PATENT DOCUMENTS

JP 2006-146152 A 6/2006

* cited by examiner

*Primary Examiner* — Stephen Rosasco
(74) *Attorney, Agent, or Firm* — Sughrue Mion, PLLC

(57) ABSTRACT

A mask blank includes a transparent substrate and a light-shielding film formed on the transparent substrate. The light-shielding film is made of a material composed mainly of a metal that is dry-etchable with a chlorine-based gas. A resist film is used to form a transfer pattern in the light-shielding film. An etching mask film is formed on an upper surface of the light-shielding film and is made of a material containing a transition metal, silicon, and at least one of nitrogen and oxygen. A content ratio of the transition metal to a total of the transition metal and the silicon in the etching mask film is less than 9%.

17 Claims, 4 Drawing Sheets

11

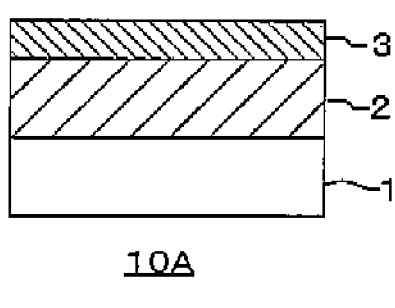
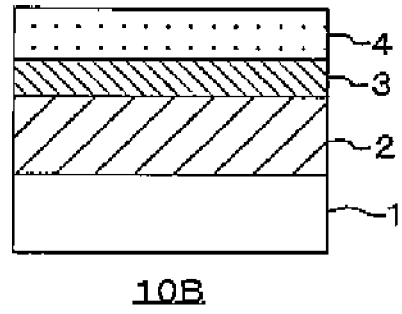
FIG. 1A  FIG. 1B
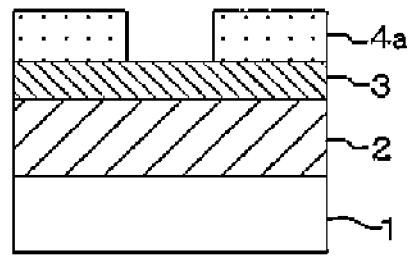
FIG. 2A
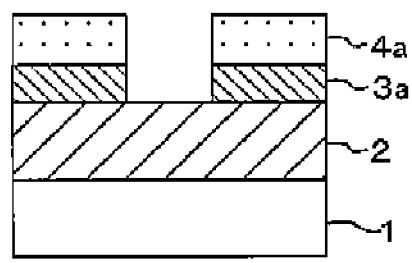
FIG. 2B
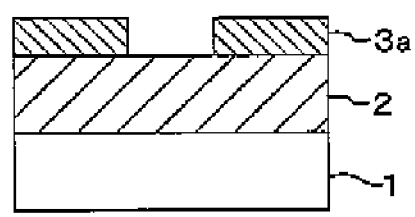
FIG. 2C
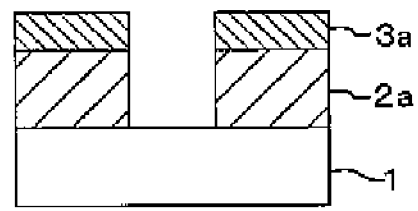
FIG. 2D

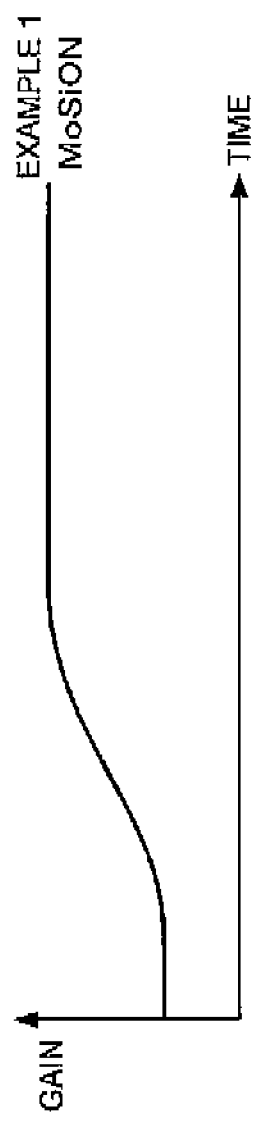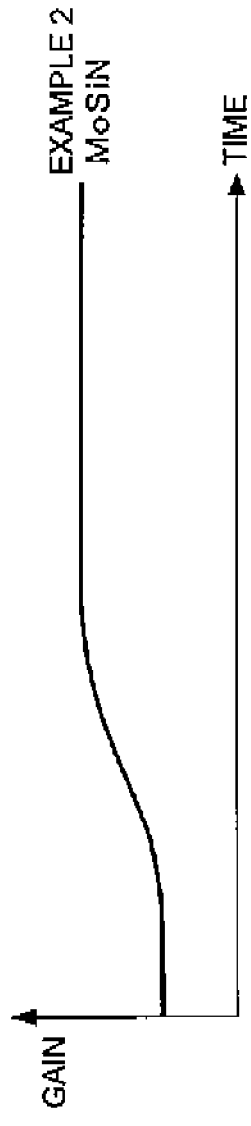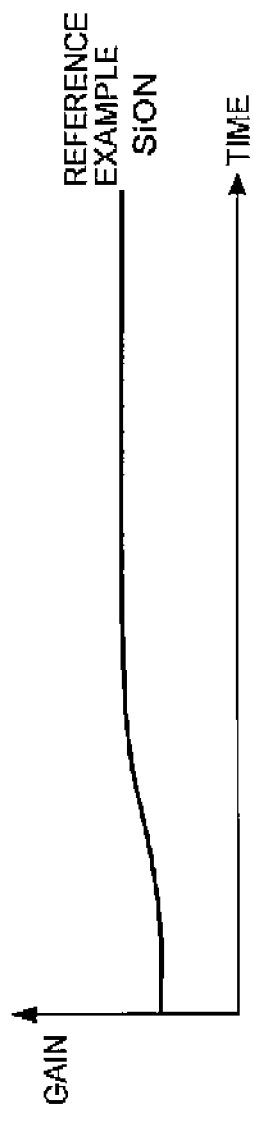
FIG. 6A
FIG. 6B
FIG. 6C

MASK BLANK AND METHOD OF MANUFACTURING A TRANSFER MASK

This application is based upon and claims the benefit of priority from Japanese Patent Application No. 2010-007590, filed on Jan. 16, 2010, the disclosure of which is incorporated herein in its entirety by reference.

TECHNICAL FIELD

This invention relates to a mask blank and a method of manufacturing a transfer mask, which enable a reduction in thickness of a resist film.

BACKGROUND ART

Generally, fine pattern formation is carried out by photolithography in the manufacture of a semiconductor device. A number of substrates called transfer masks are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by photolithography, use is made of a mask blank having a thin film (e.g. a light-shielding film) for forming a transfer pattern (mask pattern) on a transparent substrate such as a glass substrate. The manufacture of the transfer mask using the mask blank comprises an exposure process of writing a required pattern on a resist film formed on the mask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is removed by dry etching or wet etching, thereby forming a required mask pattern on the transparent substrate. In this manner, the transfer mask is produced.

For miniaturization of a pattern of a semiconductor device, it is necessary to shorten the wavelength of exposure light for use in photolithography in addition to miniaturization of the mask pattern of the transfer mask. In recent years, the wavelength of exposure light for use in the manufacture of a semiconductor device has been shortened from KrF excimer laser light (wavelength: 248 nm) to ArF excimer laser light (wavelength: 193 nm).

As a type of transfer mask, a halftone phase shift mask is known apart from a conventional binary mask having a light-shielding film pattern made of a chromium-based material or the like on a transparent substrate. This halftone phase shift mask is configured to have a phase shift film on a transparent substrate. This phase shift film is made of, for example, a material containing a molybdenum silicide compound and is adapted to transmit light having an intensity that does not substantially contribute to exposure (e.g. 1% to 20% at an exposure wavelength) and to produce a predetermined phase difference. By the use of light-semitransmissive portions formed by patterning the phase shift film and light-transmissive portions formed with no phase shift film and adapted to transmit light having an intensity that substantially contributes to exposure, the halftone phase shift mask causes the phase of the light transmitted through the light-semitransmissive portions to be substantially inverted with respect to that of the light transmitted through the light-transmissive portions so that the lights having passed near the boundaries between the light-semitransmissive portions and the light-transmissive portions and bent into the others' regions due to diffraction cancel each other out. This makes the light intensity at the boundaries approximately zero to thereby improve the contrast, i.e. the resolution, at the boundaries.

With respect to the transfer mask and the mask blank, the miniaturization of the mask pattern of the transfer mask requires a reduction in thickness of the resist film formed on the mask blank and dry etching as a patterning technique in the manufacture of the transfer mask.

However, the reduction in thickness of the resist film and the dry etching have the following technical problems.

One problem is that, for example, the processing time of the light-shielding film exists as one serious restriction to the reduction in thickness of the resist film on the mask blank. Chromium is generally used as a material of the light-shielding film and, in dry etching of chromium, a mixed gas of chlorine gas and oxygen gas is used as an etching gas. When patterning the light-shielding film by dry etching using the resist pattern as a mask, since the resist film is an organic film composed mainly of carbon, it is very weak against an oxygen plasma forming a dry etching environment. While patterning the light-shielding film by dry etching, the resist pattern formed on the light-shielding film should remain with a sufficient thickness. As one index, in order to make excellent the cross-sectional shape of the mask pattern, the resist film is required to have a thickness that still remains even when the etching time is about twice a just etching time (100% overetching). For example, since, in general, the etching selectivity of chromium as the material of the light-shielding film to the resist film is 1 or less, the thickness of the resist film is required to be twice or more that of the light-shielding film. Therefore, it is necessary to shorten the processing time of the light-shielding film for reducing the thickness of the resist film and, for that purpose, it is important to reduce the thickness of the light-shielding film. However, while reducing the thickness of the light-shielding film, the light-shielding film is required to have a predetermined optical density (normally 3.0 or more at a wavelength of exposure light for use with a mask) for ensuring its light-shielding performance and therefore the reduction in thickness of the light-shielding film has its own limitation.

In view of this, as a method of reducing the thickness of the resist film, there has been proposed a method of forming, on a light-shielding film, an etching mask film made of a material to which the etching selectivity of the light-shielding film is high, then etching the etching mask film using a resist pattern as a mask to form an etching mask film pattern, and then etching the light-shielding film using the etching mask film pattern as a mask to form a light-shielding film pattern (see JP-A-2006-146152 (Patent Document 1)). In Patent Document 1, an oxynitride of silicon or the like is proposed as a material of the etching mask film.

SUMMARY OF THE INVENTION

In the case of the etching mask film of the oxynitride of silicon (e.g. SiON), the film formation is carried out by sputtering using a Si target, but there is a drawback that the conductivity of the target is low so that defects tend to occur. Particularly in the case of the film formation by DC sputtering, defects tend to occur. Further, in the case of, for example, the SiON film, the etching rate is somewhat low even in dry etching using a fluorine-based gas.

When forming a resist pattern in a resist film, even if the resist film is formed on a surface of a chromium-based light-shielding film with high adhesion to the resist film, if the line width of the resist pattern becomes smaller than ⅓ of the thickness of the resist film, collapse, chipping, or the like of the resist pattern occurs and therefore the thickness of the resist film should be set to three times or less than the line width of the resist pattern. Taking this into account, the thickness of the resist film should be set to 180 nm or less in the DRAM half-pitch 45 nm generation and further to 100 nm or less in the DRAM half-pitch 32 nm generation. However, in the case of the etching mask film using the oxynitride of silicon as its material, there is a problem that since its etching selectivity to the resist film is low, the reduction in thickness of the resist film cannot be sufficiently achieved.

On the other hand, because of the reduction in thickness of the resist film, the resist film has no thickness margin for consumption during etching of the etching mask film and thus the accuracy of etching endpoint detection is getting very important in terms of CD (critical dimension) stability. However, there is a problem that the reflectance of the etching mask film made of the oxynitride of silicon is low for red laser light which is mainly used in the etching endpoint detection, thus making difficult the etching endpoint detection.

This invention has been made in view of such conventional circumstances and has objects firstly to provide a mask blank and a method of manufacturing a transfer mask, which can sufficiently achieve a reduction in thickness of a resist film, and secondly to provide a mask blank and a method of manufacturing a transfer mask, which can ensure high manufacturing stability.

The present inventor has made a study of using, as a material of an etching mask film, a material containing an oxynitride of silicon and a transition metal. It has been found that as the content ratio of the transition metal in the film increases, the reactivity increases and the etching rate with a fluorine-based gas also increases. However, it has been found that when the content ratio of the transition metal to the total of the transition metal and the silicon in the etching mask film (i.e. the ratio of the content [at %] of the transition metal expressed by percent [%] assuming that the total content [at %] of the transition metal and the silicon in the etching mask film is given as 100; the same shall apply hereinafter) is 9% or more, a new problem arises.

In the case of an oxynitride of silicon or a material containing an oxynitride of silicon and a transition metal, the adhesion to a resist film is lower than that of a chromium-based material so that even if the ratio of the line width of a resist pattern to the thickness of the resist film is ⅓ or more, collapse, chipping, or the like of the resist pattern tends to occur. Therefore, it is necessary to coat the resist film on the etching mask film after a surface treatment with a silane-based coupling agent such as HMDS (hexamethyldisilazane) is applied to the etching mask film for ensuring the adhesion to the resist film. However, it has been found that when the content ratio of the transition metal to the total of the transition metal and the silicon in the etching mask film is 9% or more, if the resist film is coated after the surface treatment with the silane-based coupling agent, circular coating unevenness defects occur in the resist film to cause a serious problem in the resist coating properties as shown in FIG. 5. This phenomenon does not change in tendency even if the kind of transition metal is changed. As a result of further intensive studies, the present inventor has found that the problem of the resist coating properties can be solved by optimizing the content of the transition metal.

The present inventor has completed this invention as a result of further continuing intensive studies based on the elucidated fact and consideration described above.

Specifically, in order to achieve the above-mentioned objects, this invention has the following structures.

(Structure 1)
A mask blank, comprising:
a transparent substrate, and
a light-shielding film formed on the transparent substrate and made of a material composed mainly of a metal that is dry-etchable with a chlorine-based gas, a resist film being used to form a transfer pattern in the light-shielding film,
wherein an etching mask film is formed on an upper surface of the light-shielding film and is made of a material containing a transition metal, silicon, and at least one of nitrogen and oxygen,
wherein a content ratio of the transition metal to a total of the transition metal and the silicon in the etching mask film is less than 9%.

(Structure 2)
The mask blank according to Structure 1, wherein a surface treatment with a silane-based coupling agent is applied to a surface of the etching mask film.

(Structure 3)
The mask blank according to Structure 2, wherein the silane-based coupling agent is hexamethyldisilazane.

(Structure 4)
The mask blank according to Structure 2, wherein the resist film is formed in contact with a surface of the etching mask film.

(Structure 5)
The mask blank according to Structure 1, wherein the transition metal in the etching mask film is molybdenum (Mo).

(Structure 6)
The mask blank according to Structure 1, wherein the etching mask film has a thickness of 5 nm to 20 nm.

(Structure 7)
The mask blank according to Structure 4, wherein the resist film has a thickness of 50 nm to 180 nm.

(Structure 8)
The mask blank according to Structure 1, wherein the metal that forms the light-shielding film and is dry-etchable with the chlorine-based gas is chromium.

(Structure 9)
The mask blank according to Structure 1, wherein a phase shift film is formed between the transparent substrate and the light-shielding film.

(Structure 10)
The mask blank according to Structure 9, wherein the phase shift film is made of a material containing a transition metal, silicon, and at least one of nitrogen and oxygen.

(Structure 11)
The mask blank according to Structure 10, wherein the transition metal in the phase shift film is molybdenum (Mo).

(Structure 12)
A method of manufacturing a transfer mask using the mask blank according to Structure 1, comprising the steps of:
applying a surface treatment with a silane-based coupling agent to a surface of the etching mask film;
forming a resist film in contact with the surface of the etching mask film after the surface treatment;
exposing a transfer pattern on the resist film to form a resist pattern;
dry-etching the etching mask film with a fluorine-based gas using the resist pattern as a mask to form an etching mask film pattern; and dry-etching the light-shielding film with a chlorine-based gas using the etching mask film pattern as a mask to form a light-shielding film pattern.

(Structure 13)

A method of manufacturing a transfer mask using the mask blank according to Structure 9, comprising the steps of:

applying a surface treatment with a silane-based coupling agent to a surface of the etching mask film;

forming a resist film in contact with the surface of the etching mask film after the surface treatment;

exposing a transfer pattern on the resist film to form a resist pattern;

dry-etching the etching mask film with a fluorine-based gas using the resist pattern as a mask to form an etching mask film pattern;

dry-etching the light-shielding film with a chlorine-based gas using the etching mask film pattern as a mask to form a light-shielding film pattern; and dry-etching the phase shift film with a fluorine-based gas using the light-shielding film pattern as a mask to form a phase shift film pattern.

According to this invention, by forming an etching mask film made of a material containing a transition metal, silicon, and at least one of nitrogen and oxygen on an upper surface of a light-shielding film formed on a transparent substrate and setting the content ratio of the transition metal to the total of the transition metal and the silicon in the etching mask film to less than 9%, it is possible to provide a mask blank and a method of manufacturing a transfer mask, in which the etching mask film has a high etching selectivity to a resist film so that it is possible to sufficiently achieve a reduction in thickness of the resist film by the use of such an etching mask film. Further, according to this invention, even if a surface treatment with a silane-based coupling agent is applied to a surface of the etching mask film, excellent resist coating properties are obtained with no occurrence of the above-mentioned conventional circular coating unevenness defects and thus it is possible to provide a mask blank and a method of manufacturing a transfer mask, which can ensure high manufacturing stability.

BRIEF DESCRIPTION OF THE DRAWINGS

FIG. 1A is a cross-sectional view showing the structure of a mask blank according to a first embodiment of this invention;

FIG. 1B is a cross-sectional view showing the structure of another mask blank according to the first embodiment of this invention;

FIG. 2A is a cross-sectional view showing one manufacturing process of a transfer mask using the mask blank according to the first embodiment of this invention;

FIG. 2B is a cross-sectional view showing one manufacturing process of the transfer mask using the mask blank according to the first embodiment of this invention;

FIG. 2C is a cross-sectional view showing one manufacturing process of the transfer mask using the mask blank according to the first embodiment of this invention;

FIG. 2D is a cross-sectional view showing one manufacturing process of the transfer mask using the mask blank according to the first embodiment of this invention;

FIG. 6A is a diagram showing a change in electrical signal obtained from an optical etching endpoint detection apparatus while dry-etching an etching mask film of Example 1;

FIG. 6B is a diagram showing a change in electrical signal obtained from the optical etching endpoint detection apparatus while dry-etching an etching mask film of Example 2; and FIG. 6C is a diagram showing a change in electrical signal obtained from the optical etching endpoint detection apparatus while dry-etching an etching mask film of a Reference Example.

DETAILED DESCRIPTION OF THE INVENTION

Figure 3A:
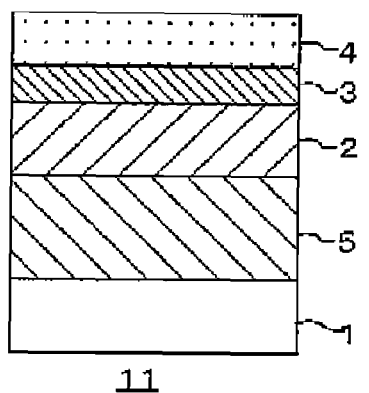
FIG. 3A is a cross-sectional view showing one manufacturing process of a transfer mask using a mask blank according to a second embodiment of this invention.

Hereinbelow, embodiments of this invention will be described in detail with reference to the drawings.

[First Embodiment]

The first embodiment of this invention is a mask blank having, on a transparent substrate, a light-shielding film made of a material composed mainly of a metal that is dry-etchable with a chlorine-based gas, and adapted to use a resist film when forming a transfer pattern in the light-shielding film, wherein an etching mask film made of a material containing a transition metal, silicon, and at least one of nitrogen and oxygen is formed on an upper surface of the light-shielding film and the content ratio of the transition metal to the total of the transition metal and the silicon in the etching mask film is less than 9%.

FIGS. 1A and 1B are sectional views respectively showing the structures of mask blanks according to the first embodiment of this invention.

FIG. 1A shows a mask blank 10A comprising a transparent substrate 1, a light-shielding film 2 formed on the transparent substrate 1, and an etching mask film 3 formed on the light-shielding film 2. FIG. 1B shows a mask blank 10B comprising a transparent substrate 1, a light-shielding film 2 formed on the transparent substrate 1, and an etching mask film 3 formed on the light-shielding film 2, wherein a surface treatment with HMDS being a silane-based coupling agent is applied to a surface of the etching mask film 3 and a resist film 4 is formed in contact with the surface of the etching mask film 3. That is, mask blanks according to this invention include not only the mask blank comprising only the transparent substrate 1, the light-shielding film 2, and the etching mask film 3, but also the mask blank which further comprises the resist film 4.

The transparent substrate 1 is not particularly limited as long as it has transparency at an exposure wavelength to be used. In this invention, a quartz substrate and various other glass substrates (e.g. soda-lime glass substrate, aluminosilicate glass substrate, etc.) can be used and, among them, the quartz substrate is particularly suitable for this invention because it has high transparency in the range of ArF excimer laser light or shorter-wavelength light.

The light-shielding film 2 is made of a material composed mainly of a metal that is dry-etchable with a chlorine-based gas. Herein, "a metal that is dry-etchable with a chlorine-based gas" is not limited to a metal that is dry-etchable only with a chlorine-based gas ($Cl_2$, $SiCl_2$, $CHCl_3$, $CCl_4$, $BCl_3$, or the like), but includes a metal that is dry-etchable with a mixed gas of such a chlorine-based gas and an oxygen gas. It is necessary that the material forming the light-shielding film 2 be resistant to dry etching using a fluorine-based gas. Metals that simultaneously satisfy this condition are hafnium (Hf), zirconium (Zr), tantalum-hafnium (Ta—Hf), tantalum-zirconium (Ta—Zr), and so on in those metals that are dry-etchable only with the chlorine-based gas, and are chromium (Cr), ruthenium (Ru), and so on in those metals that are dry-etchable with the mixed gas of the chlorine-based gas and the oxygen gas. Among them, chromium is particularly preferable because it is highly resistant to dry etching using the fluorine-based gas and is excellent in oxidation stability.

The material forming the light-shielding film 2 may contain oxygen, nitrogen, carbon, boron, or the like in addition to the metal that is dry-etchable with the chlorine-based gas. The light-shielding film 2 may be in the form of a single layer or a plurality of layers (e.g. a laminated structure of a light-shielding layer and an antireflection layer). When forming the light-shielding film 2 by laminating the light-shielding layer and the antireflection layer, the antireflection layer is preferably made of a chromium-based material for obtaining a high etching selectivity to the overlying etching mask film 3. Herein, "composed mainly of" represents that the content of the metal that is dry-etchable with the chlorine-based gas is 50% or more in all metal components of the material.

The etching mask film 3 is made of a material containing a transition metal, silicon, and at least one of nitrogen and oxygen.

Specifically, it is preferable to use a material containing a transition metal and a nitride, oxide, or oxynitride of silicon. As the transition metal, use can be made of molybdenum, tantalum, tungsten, titanium, chromium, hafnium, nickel, vanadium, zirconium, ruthenium, rhodium, or the like.

Figure 5:
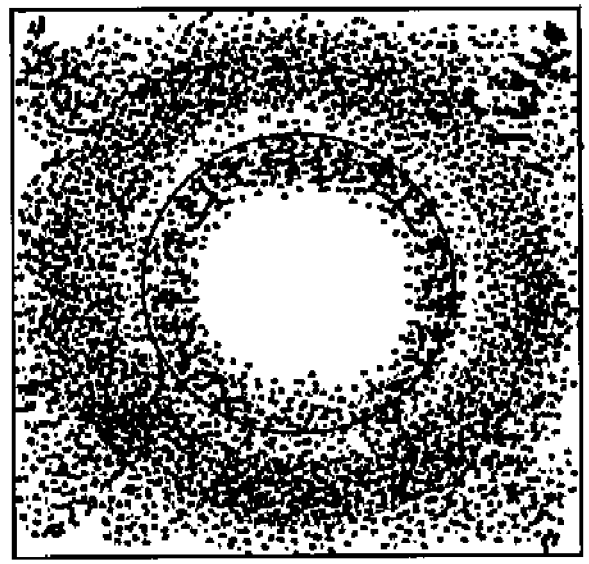
FIG. 5 is a cross-sectional view showing the results of defect inspection of a resist film of a mask blank according to a Comparative Example of this invention.

In this invention, the content ratio of the transition metal to the total of the transition metal and the silicon in the etching mask film 3 is less than 9%. If the content ratio of the transition metal is 9% or more, the resist coating properties after a surface treatment with HINDS are degraded, resulting in the occurrence of circular coating unevenness defects as shown in FIG. 5. The upper limit of the content ratio of the transition metal is preferably 8% or less, more preferably 7% or less, and most preferably 5% or less. The lower limit of the content ratio of the transition metal is preferably 1% or more. If the content ratio of the transition metal is less than 1%, there is no substantial difference in the conductivity of a target, the etching rate with a fluorine-based gas, and the accuracy of etching endpoint detection as compared with the case where no transition metal is added. Therefore, the lower limit of the content ratio of the transition metal should be 1% or more and is preferably 2% or more In this invention, particularly when forming the etching mask film 3 of molybdenum (Mo) and a nitride or oxynitride of silicon (Si), the upper limit of the content ratio of the molybdenum to the total of the molybdenum and the silicon in the etching mask film 3 (i.e. the ratio of the content [at %] of the molybdenum expressed by percent [%] assuming that the total content [at %] of the molybdenum and the silicon in the etching mask film 3 is given as 100; the same shall apply hereinafter) should be less than 9% and is preferably 8% or less, more preferably 7% or less, and most preferably 5% or less. The lower limit of the content ratio of the molybdenum should be 1% or more and is preferably 2% or more.

The thickness of the etching mask film 3 is preferably 5 nm to 20 nm. If the thickness is less than 5 nm, it is not possible to ensure a thickness which is necessary for the etching mask film 3 to function as an etching mask in dry etching of the light-shielding film 2. On the other hand, if the thickness exceeds 20 nm, the thickness of a resist pattern for etching the etching mask film 3 should be set large so that it is not possible to achieve a reduction in thickness of a resist film which is adaptable even to the DRAM half-pitch 45 nm generation. Particularly in the case of a mask blank for use in the DRAM half-pitch 32 nm generation, the thickness of the etching mask film 3 is preferably 15 nm or less and more preferably 10 nm or less. Sputtering is particularly preferable for forming the light-shielding film 2 and the etching mask film 3 on the transparent substrate 1. This invention is particularly effective if DC sputtering is applied to the formation of the etching mask film 3.

According to the mask blank of this embodiment, the etching mask film has a high dry-etching rate with a fluorine-based gas and thus has a high etching selectivity to the resist film so that it is possible to sufficiently achieve a reduction in thickness of the resist film by the use of such an etching mask film. Specifically, the thickness of the resist film can be reduced to a range of, for example, 50 nm to 180 nm. Particularly in the case where the thickness of the etching mask film is set to 15 nm or less, the thickness of the resist film can be reduced to a range of 50 nm to 100 nm.

Further, even if the surface treatment with the silane-based coupling agent (particularly HMDS) is applied to the surface of the etching mask film, excellent resist coating properties are obtained with no occurrence of the above-mentioned conventional circular coating unevenness defects and thus the mask blank with high manufacturing stability is obtained.

Next, referring to FIGS. 2A to 2D, a description will be given of manufacturing processes of a transfer mask using the mask blank according to this embodiment.

Herein, the description will be given using the mask blank 105 (see FIG. 1B) of this embodiment. First, using an electron beam writing apparatus, a required pattern is written on the resist film 4 and, thereafter, the resist film 4 is developed with a predetermined developer, thereby forming a resist pattern 4a (see FIG. 2A).

Then, using the resist pattern 4a as a mask, the etching mask film 3 is dry-etched, thereby forming an etching mask film pattern 3a (see FIG. 2B). A fluorine-based gas can be used as a dry etching gas.

Then, after removing the remaining resist pattern 4a (see FIG. 2C), the light-shielding film 2 is dry-etched using the etching mask film pattern 3a as a mask, thereby forming a light-shielding film pattern 2a. A chlorine-based gas (including a mixed gas of chlorine and oxygen) can be used as a dry etching gas.

In this manner, a binary transfer mask 20 is obtained (see FIG. 2D).

[Second Embodiment]

Referring to FIGS. 3A to 3G, the second embodiment of this invention will be described.

A mask blank according to this embodiment is a phase shift mask blank 11 having a structure in which a phase shift film 5 is formed between the transparent substrate 1 and the light-shielding film 2 in the mask blank according to the above-mentioned first embodiment (see FIG. 3A).

Since a transparent substrate 1, a light-shielding film 2, and an etching mask film 3 in this embodiment are the same as those in the first embodiment, a duplicate description thereof is omitted herein.

The phase shift film 5 is adapted to transmit light having an intensity that does not substantially contribute to exposure (e.g. 1% to 20% at an exposure wavelength) and to produce a predetermined phase difference (e.g. 180 degrees). By the use of light-semitransmissivo portions formed by patterning the phase shift film 5 and light-transmissive portions formed with no phase shift film 5 and adapted to transmit light having an intensity that substantially contributes to exposure, the phase of the light transmitted through the light-semitransmissive portions is caused to be substantially inverted with respect to that of the light transmitted through the light-transmissive portions so that the lights having passed near the boundaries between the light-semitransmissive portions and the light-transmissive portions and bent into the others' regions due to diffraction cancel each other out. This makes the light intensity at the boundaries approximately zero to thereby improve the contrast, i.e. the resolution, at the boundaries.

The phase shift film 5 is preferably made of a material containing a transition metal, silicon, and at least one of nitrogen and oxygen. For example, it is preferable to use a material containing a nitride, oxide, or oxynitride of transition metal silicide. As the transition metal, use can be made of molybdenum, tantalum, tungsten, titanium, chromium, hafnium, nickel, vanadium, zirconium, ruthenium, rhodium, or the like. The phase shift film 5 may be in the form of a single layer or a plurality of layers.

Also according to the mask blank (phase shift mask blank) of this embodiment, the etching mask film has a high dry-etching rate with a fluorine-based gas and thus has a high etching selectivity to the resist film so that it is possible to sufficiently achieve a reduction in thickness of the resist film by the use of such an etching mask film, Specifically, the thickness of the resist film can be reduced to a range of, for example, 50 nm to 180 nm.

Further, even if a surface treatment with the silane-based coupling agent (particularly HMDS) is applied to a surface of the etching mask film, excellent resist coating properties are obtained with no occurrence of the above-mentioned conventional circular coating unevenness defects and thus the mask blank with high manufacturing stability is obtained.

Next, referring to FIGS. 3A to 3G, a description will be given of manufacturing processes of a transfer mask using the mask blank according to this embodiment.

The mask blank 11 (see FIG. 3A) of this embodiment comprises, on the transparent substrate 1, the phase shift film 5, the light-shielding film 2, and the etching mask film 3, wherein the surface treatment with the silane-based coupling agent is applied to the surface of the etching mask film 3 and the resist film 4 is formed in contact with the surface of the etching mask film 3.

Figure 3B:
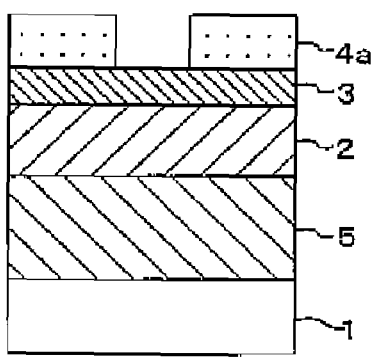
FIG. 3B is a cross-sectional view showing one manufacturing process of the transfer mask using the mask blank according to the second embodiment of this invention.
Figure 3C:
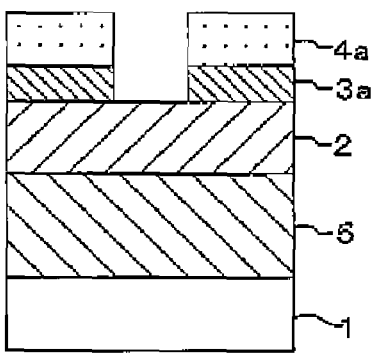
FIG. 3C is a cross-sectional view showing one manufacturing process of the transfer mask using the mask blank according to the second embodiment of this invention.
Figure 3D:
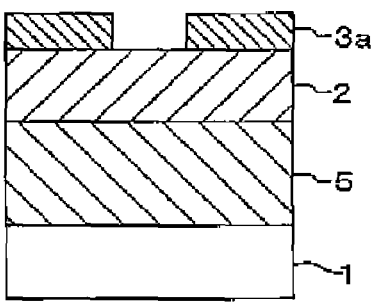
FIG. 3D is a cross-sectional view showing one manufacturing process of the transfer mask using the mask blank according to the second embodiment of this invention.

First, using an electron beam writing apparatus, a required pattern is written on the resist film 4 and, thereafter, the resist film 4 is developed with a predetermined developer, thereby forming a resist pattern 4a (see FIG. 3B).

Then, using the resist pattern 4a as a mask, the etching mask film 3 is dry-etched, thereby forming an etching mask film pattern 3a (see FIG. 3O). A fluorine-based gas can be used as a dry etching gas.

Figure 3E:
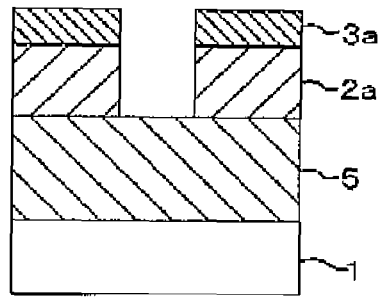
FIG. 3E is a cross-sectional view showing one manufacturing process of the transfer mask using the mask blank according to the second embodiment of this invention.

Then, after removing the remaining resist pattern 4a (see FIG. 3D), the light-shielding film 2 is dry-etched using the etching mask film pattern 3a as a mask, thereby forming a light-shielding film pattern 2a (see FIG. 3E). A chlorine-based gas (including a mixed gas of chlorine and oxygen) can be used as a dry etching gas.

Figure 3F:
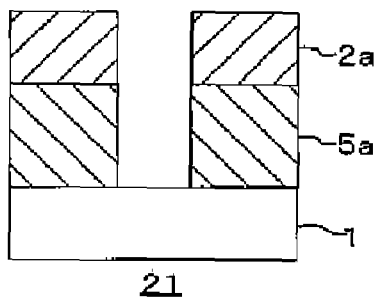
FIG. 3F is a cross-sectional view showing one manufacturing process of the transfer mask using the mask blank according to the second embodiment of this invention.
Figure 3G:
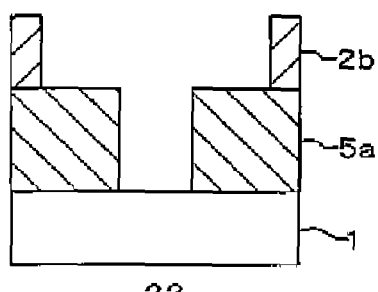
FIG. 3G is a cross-sectional view showing one manufacturing process of the transfer mask using the mask blank according to the second embodiment of this invention.

Then, using the light-shielding film pattern 2a as a mask, the phase shift film 5 is dry-etched, thereby forming a phase shift film pattern 5a (see FIG. 3F). A fluorine-based gas can be used as a dry etching gas. At this stage, the etching mask film pattern 3a is almost removed by the fluorine-based gas, In this manner, a phase shift mask (transfer mask) 21 is obtained. However, depending on the structure of a phase shift mask, the light-shielding film pattern 2a may be entirely removed or, as shown in FIG. 3G, the light-shielding film pattern 2a may be further patterned by photolithography, thereby obtaining a phase shift mask 22 formed with a light-shielding band 2b.

EXAMPLES

Hereinbelow, the embodiments of this invention will be described in further detail with reference to Examples. A description will also be given of a Comparative Example in contrast to the Examples.

Example 1

Using a single-wafer DC sputtering apparatus and using a chromium target as a sputtering target, reactive sputtering was carried out by setting the power of a DC power supply to 1.7 kW in a mixed gas atmosphere of argon, carbon dioxide, nitrogen, and helium (gas pressure 0.2 Pa; gas flow rate ratio $Ar:CO_2:N_2:He=24:29:12:35$), thereby forming a CrOCN layer with a thickness of 39 nm on a transparent substrate of a quartz glass. Then, using the chromium target, reactive sputtering was carried out by setting the power of the DC power supply to 1.7 kW in a mixed gas atmosphere of argon, nitrogen monoxide, and helium (gas pressure 0.2 Pa; gas flow rate ratio $Ar:NO:He=27:18:55$), thereby forming a CrON layer with a thickness of 17 nm. Finally, using the chromium target, reactive sputtering was carried out by setting the power of the DC power supply to 1.8 kW in a mixed gas atmosphere of argon, carbon dioxide, nitrogen, and helium (gas pressure 0.2 Pa; gas flow rate ratio $Ar:CO_2:N_2:He=21:37:11:31$), thereby forming a CrOCN layer with a thickness of 14 nm. Through the processes described above, a light-shielding film with a total thickness of 70 nm was formed. This light-shielding film had an optical density (OD) of 3.1 at a wavelength of 193 nm.

Then, using a mixed target of molybdenum (Mo) and silicon (Si) (at % ratio Mo:Si=4:96) as a sputtering target, reactive sputtering was carried out by setting the power of the DC power supply to 3.0 kW in a mixed gas atmosphere of argon (Ar), oxygen, nitrogen, and helium (gas pressure 0.1 Pa; gas flow rate ratio $Ar:O_2:N_2:He=6:5:11:16$), thereby forming a MoSiON film (etching mask film; Mo:2.5 at %, Si:62.7 at %, O:12.4 at %, N:22.4 at %) having a thickness of 15 nm.

Figure 4:
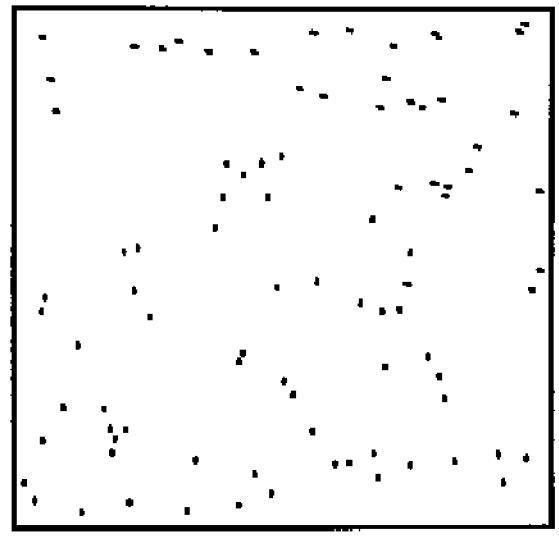
FIG. 4 is a cross-sectional view showing the results of defect inspection of a resist film of a mask blank according to Example 1 of this invention.

Then, using a mask blank thus manufactured, a binary transfer mask was manufactured. First, after applying an HMDS treatment to a surface of the mask blank under predetermined conditions, a chemically amplified positive resist film for electron beam writing (PRL009 manufactured by FUJIFILM Electronic Materials Co., Ltd.) was formed on the surface of the mask blank. The resist film was formed by spin coating using a spinner (spin coating apparatus). After coating the resist film, a predetermined heated-air drying treatment was carried out using a heated-air dryer. The thickness of the resist film was set to 100 nm. The formed resist film was subjected to defect inspection using a defect inspection apparatus (M2350 manufactured by Lasertec Corporation). The defect inspection was conducted in a high-sensitivity mode with respect to a 132 mm square area from the center of the mask blank, which was an area for forming a transfer pattern. The results are shown in FIG. 4. No circular coating unevenness defects occurred in the resist film and, further, detected defects were within an allowable range for a mask blank of the DRAM half-pitch 45 nm generation, so that the resist coating properties were excellent.

Then, using an electron beam writing apparatus, a required pattern was written on the resist film formed on the mask blank and, thereafter, the resist film was developed with a predetermined developer, thereby forming a resist pattern. In this event, no collapse or chipping of the resist pattern occurred.

Then, using the resist pattern as a mask, the etching mask film in the form of the MoSiON film was dry-etched, thereby forming an etching mask film pattern. A mixed gas of $SF_6$ and He was used as a dry etching gas.

Then, after stripping the remaining resist pattern, the light-shielding film comprising the light-shielding layer and the antireflection layers was dry-etched using the etching mask film pattern as a mask, thereby forming a light-shielding film pattern. A mixed gas of $Cl_2$ and $O_2$ ($Cl_2:O_2=4:1$) was used as a dry etching gas.

In this manner, the binary transfer mask was obtained. The CD change of the light-shielding film pattern was 2 nm or less and thus it was formed with excellent pattern accuracy.

As in this Example, using the etching mask film made of MoSiON with a Mo content ratio (ratio of the content [at %] of Mo expressed by percent [%] assuming that the total content [at %] of Mo and Si is given as 100; the same shall apply hereinafter) of less than 9%, the thickness of the resist film can be reduced and, even if the HMDS treatment is carried out for improving the adhesion to the resist film, excellent resist coating properties are obtained.

Example 2

Using a single-wafer DC sputtering apparatus and using a mixed target of molybdenum (Mo) and silicon (Si) (at % ratio Mo:Si=10:90) as a sputtering target, reactive sputtering (DC sputtering) was carried out by setting the power of a DC power supply to 2.8 kW in a mixed gas atmosphere of argon (Ar), nitrogen ($N_2$), and helium (He) (gas pressure 0.3 Pa; gas flow rate ratio Ar:$N_2$:He=5:49:46), thereby forming a MoSiN film with a thickness of 69 nm on a transparent substrate of a quartz glass. Then, the substrate formed with the MoSiN film was heat-treated (annealed) at 250° C. for 5 minutes, thereby forming a phase shift film for ArF excimer laser light (wavelength: 193 nm) in the form of a single layer composed mainly of molybdenum, silicon, and nitrogen. This phase shift film had a transmittance of 5.24% and a phase difference of 173.85 degrees for ArF excimer laser light (wavelength: 193 nm).

Then, using a chromium target as a sputtering target, reactive sputtering was carried out by setting the power of the DC power supply to 1.7 kW in a mixed gas atmosphere of argon, carbon dioxide, nitrogen, and helium (gas pressure 0.2 Pa; gas flow rate ratio Ar:$CO_2$:$N_2$:He=22:39:6:33), thereby forming a CrOCN layer with a thickness of 30 nm. Then, using the chromium target, reactive sputtering was carried out by setting the power of the DC power supply to 1.7 kW in a mixed gas atmosphere of argon and nitrogen (gas pressure 0.1 Pa; gas flow rate ratio Ar:$N_2$=83:17), thereby forming a CrN layer with a thickness of 4 nm. Finally, using the chromium target, reactive sputtering was carried out by setting the power of the DC power supply to 1.8 kW in a mixed gas atmosphere of argon, carbon dioxide, nitrogen, and helium (gas pressure 0.2 Pa; gas flow rate ratio Ar:$CO_2$:$N_2$:He=21:37:11:31), thereby forming a CrOCN layer with a thickness of 14 nm. Through the processes described above, a light-shielding film with a total thickness of 48 nm was formed. This light-shielding film had an optical density (OD) of 3, 1 at a wavelength of 193 nm in the laminated structure with the phase shift film.

Then, using a mixed target of molybdenum (Mo) and silicon (Si) (at % ratio Mo:Si=4:96) as a sputtering target, reactive sputtering was carried out by setting the power of the DC power supply to 3.0 kW in a mixed gas atmosphere of argon (Ar), nitrogen ($N_2$), and helium (He) (gas pressure 0.1 Pa; gas flow rate ratio Ar:$N_2$:He=6:11:16), thereby forming a MoSiN film (etching mask film; Mo:2.3 at %, Si:56.6 at %, N:41.1 at %) having a thickness of 10 nm.

Then, using a phase shift mask blank thus manufactured, a phase shift mask was manufactured. First, after applying an HMDS treatment to a surface of the mask blank under predetermined conditions, a chemically amplified positive resist film for electron beam writing (PRL009 manufactured by FUJIFILM Electronic Materials Co., Ltd.) was formed on the surface of the mask blank. The resist film was formed by spin coating using a spinner (spin coating apparatus). After coating the resist film, a predetermined heated-air drying treatment was carried out using a heated-air dryer. The thickness of the resist film was set to 90 nm. The formed resist film was subjected to defect inspection using a defect inspection apparatus (M2350 manufactured by Lasertec Corporation). The defect inspection was conducted in a high-sensitivity mode with respect to a 132 mm square area from the center of the mask blank, which was an area for forming a transfer pattern. As a result, like in Example 1, no circular coating unevenness defects occurred in the resist film and, further, detected defects were within an allowable range for a mask blank of the DRAM half-pitch 32 nm generation, so that the resist coating properties were excellent.

Then, using an electron beam writing apparatus, a required pattern was written on the resist film formed on the mask blank and, thereafter, the resist film was developed with a predetermined developer, thereby forming a resist pattern.

Then, using the resist pattern as a mask, the etching mask film in the form of the MoSiN film was dry-etched, thereby forming an etching mask film pattern. A mixed gas of $SF_6$ and He was used as a dry etching gas.

Then, after stripping the remaining resist pattern, the light-shielding film comprising the light-shielding layer and the antireflection layers was dry-etched using the etching mask film pattern as a mask, thereby forming a light-shielding film pattern. A mixed gas of $Cl_2$ and $O_2$ ($Cl_2:O_2=4:1$) was used as a dry etching gas.

Then, using the light-shielding film pattern as a mask, the phase shift film in the form of the MoSiN film was dry-etched, thereby forming a phase shift film pattern. A mixed gas of $SF_6$ and He was used as a dry etching gas. The etching mask film pattern was removed while dry-etching the phase shift film.

Then, a resist film, which was the same as that described above, was coated again over the entire surface and, after writing a pattern to be used for removing an unnecessary portion of the light-shielding film pattern in the transfer area, the resist film was developed, thereby forming a resist pattern. Then, using this resist pattern as a mask, the unnecessary portion of the light-shielding film pattern was removed by dry etching, and then the remaining resist pattern was stripped, thereby obtaining a phase shift mask.

In this manner, the phase shift mask was manufactured. The CD change of the phase shift film pattern was less than 2 nm and thus it was formed with excellent pattern accuracy.

As in this Example, using the etching mask film made of MoSiN with a Mo content ratio of less than 9%, the thickness of the resist film can be reduced and, even if the HMDS treatment is carried out for improving the adhesion to the resist film, excellent resist coating properties are obtained.

Example 3

Through the same processes as in Example 2, a phase shift film for ArF excimer laser light (wavelength: 193 nm) and a light-shielding film made of materials composed mainly of chromium were formed in this order on a transparent substrate of a quartz glass.

Then, using a mixed target of molybdenum (Mo) and silicon (Si) (at % ratio Mo:Si=4:96) as a sputtering target, a MoSiON film (etching mask film; Mo:1.8 at %, Si:37.2 at %, 0:12.9 at %, N:48.1 at %) was formed to a thickness of 10 nm in a mixed gas atmosphere of argon (Ar), oxygen, nitrogen, and helium.

Then, using a phase shift mask blank thus manufactured, a phase shift mask was manufactured. First, after applying an HMDS treatment to a surface of the mask blank under predetermined conditions, a chemically amplified positive resist film for electron beam writing (PRL009 manufactured by FUJIFILM Electronic Materials Co., Ltd.) was formed on the surface of the mask blank. The resist film was formed by spin coating using a spinner (spin coating apparatus). After coating the resist film, a predetermined heated-air drying treatment was carried out using a heated-air dryer. The thickness of the resist film was set to 90 nm. The formed resist film was subjected to defect inspection using a defect inspection apparatus (M2350 manufactured by Lasertec Corporation). The defect inspection was conducted in a high-sensitivity mode with respect to a 132 mm square area from the center of the mask blank, which was an area for forming a transfer pattern. As a result, like in Example 1, no circular coating unevenness defects occurred in the resist film and, further, detected defects were within an allowable range for a mask blank of the DRAM half-pitch 32 nm generation, so that the resist coating properties were excellent.

Then, the mask blank formed with the resist film was subjected to the same processes as in Example 2, thereby manufacturing a phase shift mask. The CD change of a phase shift film pattern was less than 2 nm and thus it was formed with excellent pattern accuracy.

As in this Example, using the etching mask film made of MoSiON with a Mo content ratio of less than 9%, the thickness of the resist film can be reduced and, even if the HMDS treatment is carried out for improving the adhesion to the resist film, excellent resist coating properties are obtained.

Comparative Example

Using a single-wafer DC sputtering apparatus and using a mixed target of molybdenum (Mo) and silicon (Si) (at % ratio Mo:Si=10:90) as a sputtering target, reactive sputtering (DC sputtering) was carried out by setting the power of a DC power supply to 2.8 kW in a mixed gas atmosphere of argon (Ar), nitrogen ($N_2$), and helium (He) (gas pressure 0.3 Pa; gas flow rate ratio Ar:$N_2$:He=5:49:46), thereby forming a MoSiN film with a thickness of 69 nm on a transparent substrate of a quartz glass. Then, the substrate formed with the MoSiN film was heat-treated (annealed) at 250° C. for 5 minutes, thereby forming a phase shift film for ArF excimer laser light (wavelength: 193 nm) in the form of a single layer composed mainly of molybdenum, silicon, and nitrogen. This phase shift film had a transmittance of 5.24% and a phase difference of 173.85 degrees for ArF excimer laser light (wavelength: 193 nm).

Then, using a chromium target as a sputtering target, reactive sputtering was carried out by setting the power of the DC power supply to 1.7 kW in a mixed gas atmosphere of argon, carbon dioxide, nitrogen, and helium (gas pressure 0.2 Pa; gas flow rate ratio Ar:$CO_2$:$N_2$:He=22:39:6:33), thereby forming a CrOCN layer with a thickness of 30 nm. Then, using the chromium target, reactive sputtering was carried out by setting the power of the DC power supply to 1.7 kW in a mixed gas atmosphere of argon and nitrogen (gas pressure 0.1 Pa; gas flow rate ratio Ar:$N_2$=83:17), thereby forming a CrN layer with a thickness of 4 nm. Finally, using the chromium target, reactive sputtering was carried out by setting the power of the DC power supply to 1.8 kW in a mixed gas atmosphere of argon, carbon dioxide, nitrogen, and helium (gas pressure 0.2 Pa; gas flow rate ratio Ar:$CO_2$:$N_2$:He=21:37:11:31), thereby forming a CrOCN layer with a thickness of 14 nm. Through the processes described above, a light-shielding film with a total thickness of 48 nm was formed. This light-shielding film had an optical density (OD) of 3.1 at a wavelength of 193 nm in the laminated structure with the phase shift film.

Then, using a mixed target of molybdenum (Mo) and silicon (Si) (at % ratio Mo:Si=9.5:90.5) as a sputtering target, reactive sputtering was carried out by setting the power of the DC power supply to 3.0 kW in a mixed gas atmosphere of argon (Ar), nitrogen, and helium (gas pressure 0.1 Pa; gas flow rate ratio Ar:$N_2$:He=5:49:46), thereby forming a MoSiN film (etching mask film; Mo:5.1 at %, Si:47.1 at %, N:47.8 at %) having a thickness of 10 nm.

Then, using a phase shift mask blank thus manufactured, a phase shift mask was manufactured. First, after applying an HMDS treatment to a surface of the mask blank under predetermined conditions, a chemically amplified positive resist film for electron beam writing (PRL009 manufactured by FUJIFILM Electronic Materials Co., Ltd.) was formed on the surface of the mask blank. The resist film was formed by spin coating using a spinner (spin coating apparatus). After coating the resist film, a predetermined heated-air drying treatment was carried out using a heated-air dryer. The thickness of the resist film was set to 90 nm. The formed resist film was subjected to defect inspection using a defect inspection apparatus (M2350 manufactured by Lasertec Corporation). The defect inspection was conducted in a low-sensitivity mode with respect to a 132 mm square area from the center of the mask blank, which was an area for forming a transfer pattern. The results are shown in FIG. 5. Although the inspection was conducted in the low-sensitivity mode with low defect detection sensitivity, circular coating unevenness defects remarkably occurred in the resist film. These were defects that were not allowable not only for a mask blank of the DRAM half-pitch 32 nm generation, but also for a mask blank of the DRAM half-pitch 45 nm generation.

Thereafter, a phase shift mask was manufactured in the same manner as in Example 2.

In a phase shift film pattern, i.e. a transfer pattern, of the obtained phase shift mask, white defects and black defects occurred in large numbers due to the defects of the resist film and, further, the CD change of the phase shift film pattern was as large as 10 nm or more due to the coating defects of the resist film. Thus, the obtained phase shift mask was no longer usable as a transfer mask of the semiconductor design rule half-pitch 45 nm and subsequent generations.

Reference Example

In this Reference Example, the same processes as in Example 2 were carried out up to the formation of a phase shift film and a light-shielding film. Then, using a silicon (Si) target as a sputtering target, a SiON film (etching mask film; Si:O:N=35:45:10 [at %]) was formed to a thickness of 10 nm in a mixed gas atmosphere of argon, nitrogen, and oxygen, thereby manufacturing a phase shift mask blank.

Then, inspection was conducted for the difference in characteristics when optical etching endpoint detection was applied to endpoint detection in dry etching of the etching mask films of the respective mask blanks of Example 1, Example 2, and the Reference Example. An optical etching endpoint detection apparatus used in this inspection is adapted to irradiate light having a wavelength of 600 to 700 nm (red laser light) on the surface of the etching mask film and to receive reflected light from the surface on a photoelectric converter to obtain a change in the reflected light in the form of an electrical signal, thereby detecting an etching endpoint based on a change in the electrical signal (change in the reflected light). FIGS. 6A, 6B, and 6C each show a change in electrical signal intensity obtained from the photoelectric converter of the optical etching endpoint detection apparatus while dry-etching the etching mask film using a mixed gas of $SF_6$ and He as an etching gas, wherein FIG. 6A relates to the mask blank of Example 1, FIG. 6B relates to the mask blank of Example 2, and FIG. 6C relates to the mask blank of the Reference Example.

In the case of the MoSiON film of Example 1, the change in electrical signal intensity (gain) is large and thus an etching endpoint can be easily detected. In the case of the MoSiN film of Example 2, the change in electrical signal intensity (gain) is relatively large and thus the detection of an etching endpoint is sufficiently enabled. In contrast, in the case of the SiON film of the Reference Example, since its transmittance for the red laser light is high (reflectance is low), the change in electrical signal intensity (gain) is small and thus it is difficult to detect an etching endpoint. In the case of the SiON film, it is preferable to use another etching endpoint detection method.

While this invention has been described with reference to the embodiments, the technical scope of the invention is not limited to the scope of the description of the above-mentioned embodiments. It is obvious to a person skilled in the art that various changes or improvements can be added to the above-mentioned embodiments. It is clear from the description of claims that the modes added with such changes or improvements can also be included in the technical scope of this invention.

What is claimed is:

1. A mask blank, comprising:
a transparent substrate, and
a light-shielding film formed on the transparent substrate and made of a material composed mainly of a metal that is dry-etchable with a chlorine-based gas, a resist film being used to form a transfer pattern in the light-shielding film,
wherein an etching mask film is formed on an upper surface of the light-shielding film and is made of a material containing a transition metal, silicon, and at least one of nitrogen and oxygen,
wherein a content ratio of the transition metal to a total of the transition metal and the silicon in the etching mask film is 5% or less.

2. The mask blank according to claim 1, wherein a surface treatment with a silane-based coupling agent is applied to a surface of the etching mask film.

3. The mask blank according to claim 2, wherein the silane-based coupling agent is hexamethyldisilazane.

4. The mask blank according to claim 2, wherein the resist film is formed in contact with a surface of the etching mask film.

5. The mask blank according to claim 4, wherein the resist film has a thickness of 50 nm to 180 nm.

6. The mask blank according to claim 1, wherein the transition metal in the etching mask film is molybdenum (Mo).

7. The mask blank according to claim 1, wherein the etching mask film has a thickness of 5 nm to 20 nm.

8. The mask blank according to claim 1, wherein the metal that forms the light-shielding film and is dry-etchable with the chlorine-based gas is chromium.

9. The mask blank according to claim 1, wherein a phase shift film is formed between the transparent substrate and the light-shielding film.

10. The mask blank according to claim 9, wherein the phase shift film is made of a material containing a transition metal, silicon, and at least one of nitrogen and oxygen.

11. The mask blank according to claim 10, wherein the transition metal in the phase shift film is molybdenum (Mo).

12. A method of manufacturing a transfer mask using the mask blank according to claim 9, comprising the steps of:
applying a surface treatment with a silane-based coupling agent to a surface of the etching mask film;
forming a resist film in contact with the surface of the etching mask film after the surface treatment;
exposing a transfer pattern on the resist film to form a resist pattern;
dry-etching the etching mask film with a fluorine-based gas using the resist pattern as a mask to form an etching mask film pattern;
dry-etching the light-shielding film with a chlorine-based gas using the etching mask film pattern as a mask to form a light-shielding film pattern; and
dry-etching the phase shift film with a fluorine-based gas using the light-shielding film pattern as a mask to form a phase shift film pattern.

13. A method of manufacturing a transfer mask using the mask blank according to claim 1, comprising the steps of:
applying a surface treatment with a silane-based coupling agent to a surface of the etching mask film;
forming a resist film in contact with the surface of the etching mask film after the surface treatment;
exposing a transfer pattern on the resist film to form a resist pattern;
dry-etching the etching mask film with a fluorine-based gas using the resist pattern as a mask to form an etching mask film pattern; and
dry-etching the light-shielding film with a chlorine-based gas using the etching mask film pattern as a mask to form a light-shielding film pattern.

14. The mask blank according to claim 1, wherein the mask blank is adaptable to DRAM half-pitch 45 nm generation and subsequent generations.

15. The mask blank according to claim 1, wherein the etching mask film further contains at least one of nitrogen and oxygen.

16. The mask blank according to claim 1, wherein the transition metal in the etching mask film contains at least one element selected from tantalum, tungsten, titanium, chromium, hafnium, nickel, vanadium, zirconium, ruthenium and rhodium.

17. The mask blank according to claim 1, wherein a metal in the light-shielding film contains at least one element selected from hafnium, zirconium, tantalum, and ruthenium.

* * * * *